United States Patent [19]

Champagne et al.

[11] Patent Number: 5,097,117
[45] Date of Patent: Mar. 17, 1992

[54] ELECTRONIC MICROCIRCUIT CARD AND METHOD FOR ITS MANUFACTURE

[75] Inventors: Daniel Champagne, Septeuil; Alain Le Loc'h, Versailles, both of France

[73] Assignee: Bull CP8, Trappes, France

[21] Appl. No.: 342,537

[22] PCT Filed: Jul. 1, 1988

[86] PCT No.: PCT/FR88/00350
§ 371 Date: Feb. 27, 1989
§ 102(e) Date: Feb. 27, 1989

[87] PCT Pub. No.: WO89/00340
PCT Pub. Date: Jan. 12, 1989

[30] Foreign Application Priority Data

Jul. 2, 1987 [FR] France ............... 87 9380

[51] Int. Cl.⁵ .................. G06K 19/02; G06K 19/06
[52] U.S. Cl. .................. 235/488; 235/492
[58] Field of Search ............ 235/487, 488, 492; 361/397, 398, 400, 402; 357/72, 74; 29/831, 841

[56] References Cited

U.S. PATENT DOCUMENTS

| | | | |
|---|---|---|---|
| 4,216,577 | 8/1980 | Badet et al. | 29/831 |
| 4,222,516 | 9/1980 | Badet et al. | 235/487 X |
| 4,549,247 | 10/1985 | Hoppe et al. | 235/487 X |
| 4,682,017 | 7/1987 | Nakahara et al. | 235/487 X |
| 4,737,620 | 4/1988 | Mollet et al. | 235/488 X |
| 4,792,843 | 12/1988 | Haghiri-Tehrani | 235/488 X |
| 4,795,895 | 1/1989 | Hara et al. | 235/488 X |
| 4,822,989 | 4/1989 | Miyamoto et al. | 235/488 X |

FOREIGN PATENT DOCUMENTS

| | | |
|---|---|---|
| 2523335 | 9/1983 | France . |
| 22575567 | 7/1986 | France . |
| 8700486 | 1/1987 | World Int. Prop. O. . |

OTHER PUBLICATIONS

IEEE International Electronic Manufacturing Technology Symposium, San Francisco, 15-17 Sep. 1986, M. Ohuchi et al.: "A New LSI Interconnection Method for IC Card", pp. 30-33.

Primary Examiner—Stuart S. Levy
Assistant Examiner—Tan Nguyen
Attorney, Agent, or Firm—Kerkam, Stowell, Kondracki & Clarke

[57] ABSTRACT

An electronic microcircuit card and method for its manufacture are disclosed. Contacts 12 that are accessible through an opening 26 of the card 10 are raised by a boss 27 formed under the contacts in such a manner that they come approximately to the level of the outer face 22a of the card. The invention applies particularly to credit cards, the thickness of which meets the standard for credit cards as established by the International Standards Organization (ISO).

13 Claims, 3 Drawing Sheets

ELECTRONIC MICROCIRCUIT CARD AND METHOD FOR ITS MANUFACTURE

The invention relates to an electronic microcircuit card and a method for manufacturing it. More particularly, it applies to the manufacture of a portable card the thickness of which meets the standard for credit cards of the International Standards Organization (ISO).

An electronic microcircuit card is a small rectangular one-piece or multi-layer plate of plastic material, which incorporates electronic microcircuits and on its outside has contacts for the connection of the electronic microcircuits with a card processing apparatus. These microcircuits may be intended for quite various functions, for instance such banking operations as debiting and crediting, billing of telephone call units, and confidential input into a secure medium. Typically, they comprise processing circuits and/or memory circuits which are more or less complex depending on their intended use. In practice, they are formed on at least one small silicon plate, currently known as an integrated circuit or chip.

The invention applies in particular to a card such as that described in French Patent No. 2 337 381 (U.S. Pat. Nos. 4,216,577 and 4,222,516), for example, of the present Applicant. One face of a printed circuit is provided with an integrated circuit, and the other face has the contacts of the card. In an exemplary embodiment, the card is made simply of a one-piece small plate, one face of which gradually has a peripheral indented zone, beginning at a deep cavity, and a step surrounding the indented zone. The integrated circuit is accommodated in the cavity, and the printed circuit is distributed over the indented zone. A foil covering the printed circuit and thus forming a cover cap is affixed to the step. The foil has its outer face substantially coplanar with the corresponding face of the small plate and includes openings that correspond with the contacts of the printed circuit. The use of the card is thus accomplished by connecting the contacts via the openings in the foil.

In a variant embodiment described in the prior art patent named above, the small plate has no indented step, and the foil covering the printed circuit covers the entire corresponding face of the small plate. Thus the card comprises the small plate and the foil. The contacts remain accessible through openings in the foil.

Another variant embodiment is described in European Patent Application No. 0 207 852, for example, of the present Applicant. The printed circuit is made of a thin ribbon, the end of one face of which has the integrated circuit and the other end of the other face of which has the contacts of the card. Thus the contacts are offset relative to the integrated circuit. This arrangement may be preferred for several reasons, in particular in order to meet the standards for placement of contacts on the long median of the card. Because the printed circuit has offset contacts, the integrated circuit can remain in one corner of the card, where the strains of flexion and torsion are markedly less than at the level of the contacts However, if the printed circuit is to be attained simply and at low cost, it must be covered with a foil provided with openings corresponding with the contacts. The foil may simply be a cover cap, or may extend over the entire face of the small plate.

These exemplary embodiments demonstrate that often the manufacture of an electronic microcircuit card requires the use of a foil provided with openings, for access to the contacts of the card that are carried by the printed circuit. The thickness of the foil for access to the contacts has several disadvantages. First, numerous applications of the card require that a finishing film be applied to the foil; second, to lend the foil good mechanical strength, so as to protect the printed circuit, the minimum thickness of the foil must be relatively great. It follows that the contacts are located at a relatively great depth in the surface of the card, for example a depth greater than 0.1 mm. Considering the various methods of manufacture of cards that can be used by an apparatus, the connector of this apparatus must adapt to as a wide a range of depths as possible, while assuring effective and reliable connection. Standards have been promulgated for limiting the maximum depth of the contacts to a relatively low value. The problem then posed is to raise the contacts within the openings in order to meet the standards and, if possible, to the contacts practically at the level of the surface of the The solution at present for raising the contacts in the openings comprises providing an accretion of copper on the contact zones that correspond with the openings. This accretion is generally accomplished by electrochemical copper plating, which requires the use of a time-consuming and expensive technology that is little used.

The invention offers a simple and relatively inexpensive solution to the problem of raising the contacts in the openings of a card.

An electronic microcircuit card die includes: a printed circuit one face of which carries an integrated circuit and the other face has contacts; a small plate, one face of which has a plane zone covered by the printed circuit, and a cavity for accommodating the integrated circuit; and a foil that covers at least the printed circuit and gives access to the contacts via at least one opening; characterized in that the zone includes a boss under the opening of the foil.

A method of manufacture of a card in accordance with the invention, including the placement of a printed circuit on one face of a small plate of plastic material provided with a cavity for accommodating an integrated circuit, and the covering of the printed circuit with a foil having a predetermined surface area and giving access to contacts of the printed circuit via at least one opening, is characterized in that prior to the covering, the method comprises: making the cavity in a uniformly plane field, having said predetermined surface area of the foil, of said face of the small plate; disposing a die, embodied by a plane blade that is a good thermal conductor and is provided with an opening corresponding to said opening of the foil and covering at least the printed circuit, above the printed circuit; heating the small plate to a molding temperature; pressing the die far enough that the upper face of the printed circuit is approximately coplanar with said field of the small plate, thus creating an indented zone in the small plate for the emplacement of the printed circuit, the zone being provided with a boss under the opening of the die; and withdrawing the die.

The characteristics and advantages of the invention will become apparent from the ensuing detailed description of an exemplary embodiment, taken in conjunction with the drawings.

Figure 1:
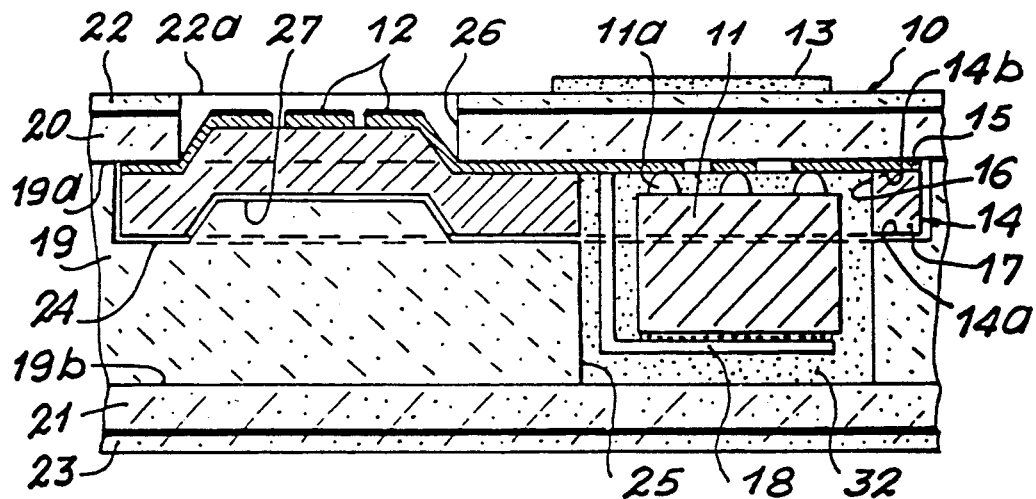
FIG. 1 is a fragmentary sectional view along the line I—I in FIG. 2, showing an exemplary embodiment of a card according to the invention.
Figure 2:
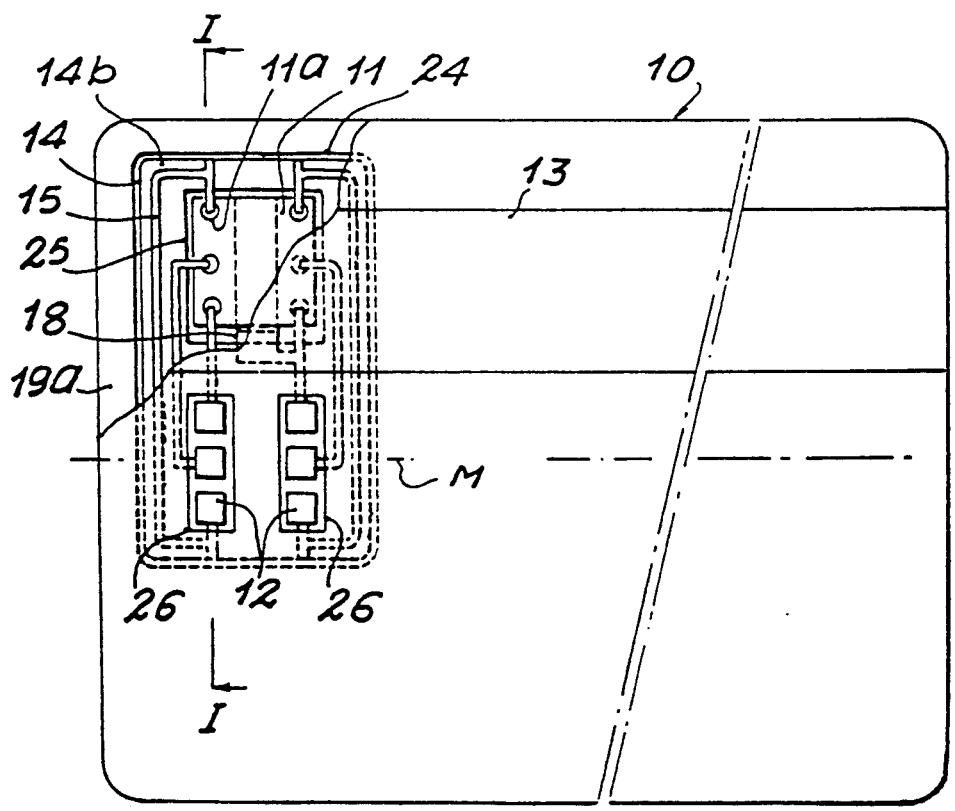
FIG. 2 is a plan view of a detail of the card shown partially in FIG. 1.

FIGS. 1 and 2 illustrate the preferred embodiment of an electronic microcircuit card 10 according to the invention, of the standardized credit card type. The electronic microcircuits are assumed to be included in a single integrated circuit 11 and are accessible via six pads 11a. One face of the card 10, of rectangular shape, has six contacts 12 for the connection of the integrated circuit 11 to a card processing apparatus, not shown. The same face of the card includes a magnetic tape 13 that carries data. By the standards selected as an example, the magnetic tape 13 is close to one long side of the card, and the contacts 12 are placed in a zone that intersects or adjoins the long median M of the card in proximity with a short side.

In the conventional manner, the card 10 includes a printed circuit 14 one face 14a of which carries the integrated circuit and the other face 14b has the contacts 12. Conductors 15 on the face 14b respectively connect the six contacts 12 to the six pads 11a of the integrated circuit 11 by the well known TAB technique (tape automated bonding). Thus the pads 11a of the integrated circuit 11 are welded to the ends mounted overhanging the conductors 15 about a window 16 of the insulating substrate 17 of the printed circuit 14. The substrate 17 is typically of a plastic material such as that known by the registered trademark "Kapton", on the order of 130 micrometers (μm) thick. The contacts 12 and the conductors 15 are ordinarily made beginning with the same metal layer of copper applied to the substrate 16 of the printed circuit. The contacts 12 are then formed by the deposition of a film of gold on at least one intermediate compatibility layer; all of these layers are represented in FIG. 1 by a solid line. Assuming that the integrated circuit 11 is of the MOS type (metal oxide semiconductor), one of the conductors 15 is extended by a polarization lead 18 affixed to the back face of the integrated circuit, for example by means of a silver-based conductive glue. Thus the printed circuit 14 shown is the type having offset contacts.

Again in the conventional manner, the card 10 is assumed to be embodied by a small central plate 19, also known as a core, the two large faces 19a, 19b of which are covered with two foils 20, 21 and two films 22, 23, respectively. The small plate and the two foils are generally made of a flexible plastic such as PVC (polyvinyl chloride). The foils are of equal thickness and are thin with respect to the plate, for example in a ratio of 130 μm: 500 μm. In numerous applications, the foils are printed, so that all the informations desired can be read there, such as the name and address of the owner of the card, the name of the company providing service by use of the card, and so forth. A solid line represents the printing applied to the outer faces of the two foils 20, 21 of FIG. 1. The two films 22, 23 are generally required for protecting the printing and for the sake of the outer appearance of the card. These films are ordinarily made of a transparent PVC crystal that makes the card glossy and have a thickness on the order of 25 μm. Ordinarily, the two foils are covered with their respective films and then applied and affixed to the small plate by thermocompression. Consequently, the term "foils" extends generally to the foil provided with its film and must thus be included in the general sense of the word, in particular as recited in the claims.

Again in the conventional manner, the printed circuit 14 is inserted between the plate 19 and the foil 20. The face 19a of the plate 19 has a zone 24 that is covered by the face 14a of the printed circuit 14 and a cavity 25 for accommodating the integrated circuit 11. In the example shown, the cavity 25 is a hole penetrating the plate 19. The foil 20 covers the printed circuit 14 and includes openings 26 that correspond with the contacts 12. In the example shown, only two openings 26 are provided, each for giving access to one group of three contacts 12. In the technique of the prior art, the printed circuit 14 rested on the zone 24 that was made uniformly planar. In this manner, the contacts 12 were placed approximately at the level of the face 19a of the plate 19. Under those conditions, the contacts were not accessible except through the entire thickness of the foil 20 and the film 22, which made a total of approximately 155 μm. Since this kind of depth cannot be allowed, the problem was to raise the contacts 12 in the openings 26 to make them closer to the outer surface 22a of the card and, if possible, to put them at this level.

According to the invention, the zone 24 includes a boss 27 under each of the two openings 26. The height of the boss is preferably the thickness of the foil 20 and of the film 22, if present, so as to put the contacts 12 at the level of the face 22a of the card 10.

The boss 27 shown is common to the three contacts 12 included in each opening 26. Naturally, a single boss would suffice, if all the contacts 12 were included in the same opening 26.

It will be understood that this boss 27 may be formed on the plate 19 prior to the mounting of the printed circuit 14. For example, the plate 19 may be molded to obtain a zone 24 provided with two bosses 27. The hole 25 could be made during or after the molding. The printed circuit would then be put in place, and then the foils 20 and 21, provided with their respective films 22, 23, would be put in place and pressed for their fixation onto the plate 19. The pressure would thus be exerted in such a way that the bosses 27 would raise the contacts 12 in the openings 26.

FIGS. 3A-3E illustrate a different method of manufacture of the card 10 shown in FIGS. 1 and 2.

Figure 3A:
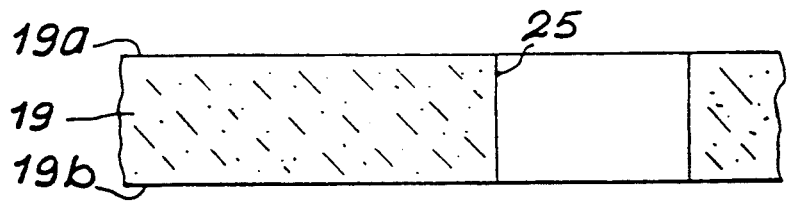
FIGS. 3A-3E are sectional views illustrating the steps in the manufacture of the card shown in FIGS. 1 and 2.
Figure 3B:
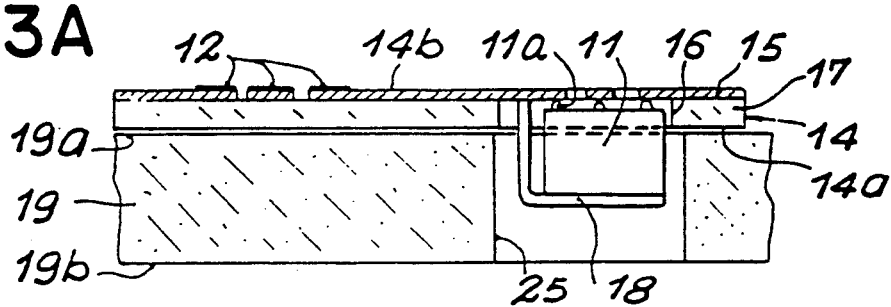
Figure 3C:
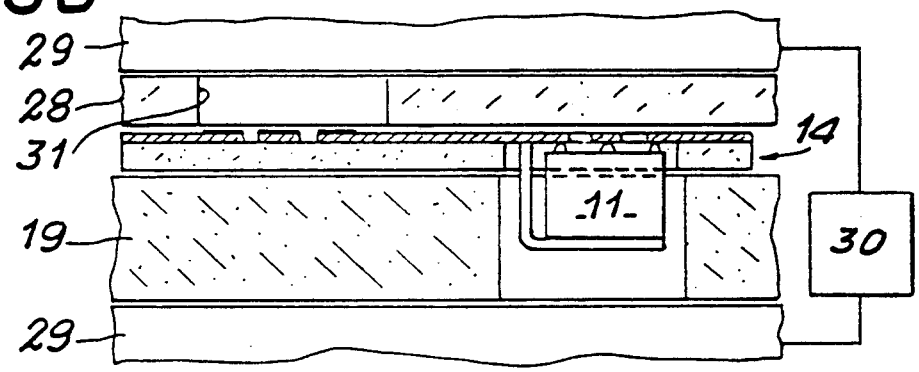
Figure 3D:
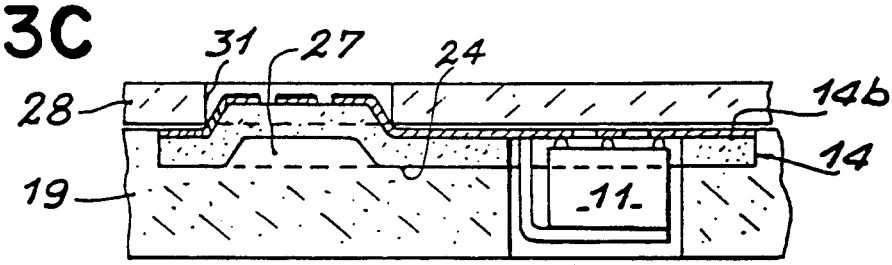
Figure 3E:
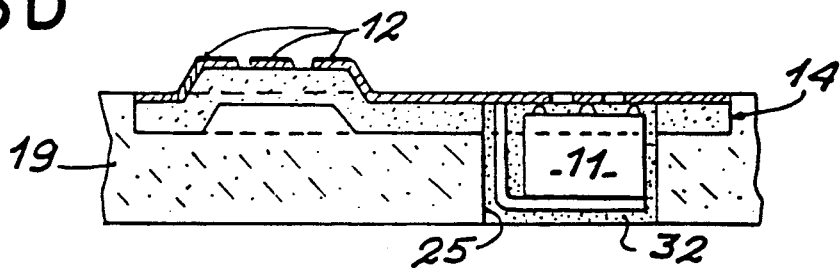

FIGS. 3A-3E respectively illustrate the intermediate phases of the method. In the initial step, in FIG. 3A, only the plate 19 is present, pierced with the hole 25 and provided with two faces 19a, 19b, which are uniformly plane and parallel. In FIG. 3B, the printed circuit 14, provided with the integrated circuit 11 accommodated in the cavity 25, has been placed on the face 19a of the plate 19. In FIG. 3C, a die 28 has been placed over the printed circuit 14, and the unit comprising the plate 19, the printed circuit 14 and the die 28, has been locked in the jaws 29 of a heating press 30. The die 28 is a uniformly plane metal blade pierced with openings 31 that correspond to the openings 26 of the foil 20 shown in FIG. 1. The die 28 shown has a surface area greater than that of the printed circuit 14. The metal comprising the die 28 is a good thermal conductor. Consequently, the heat given off by the jaws 29 of the press 30 soften the material comprising the plate 19 at the level of the printed circuit 14, and the force of the pressure exerted by the jaws 29 drives the printed circuit 14 into the plate 19. This operation lasts until the die 28 comes into contact with the face 19a of the plate 19. By way of example, the pressing operation for an ordinary PVC plate is done between 120° C. and 140° C., which is reached in 10 minutes, and is maintained for 10 minutes at a pressure of 60 bars. After the press has been raised, the configuration shown in FIG. 3D is thus obtained. In this figure, it can be seen that the pressing has been done in such a way as to put the upper face 14b of the printed circuit 14 approximately at the level of the face 19a of the plate 19. The pressing has thus created the indented zone 24 in the face 19a of the plate. At the same time, the openings 31 of the die 28 have permitted the formation of the bosses 27. It will be clear to one skilled in the art that the height of the bosses 27 obtained by this method depends on the thickness of the printed circuit, the thickness of the die 28, and the softening temperature of the PVC. In the step shown in FIG. 3E, the die 28 has been withdrawn, and the cavity 25 has been filled with an embedding substance 32. Hence it suffices to emplace and affix the foils 20 and 21, provided with their respective films 22, 23, in order to obtain the card shown in FIGS. 1 and 2.

This method can be embodied in several variant ways. For example, to avoid heating the integrated circuit 11, it would be sufficient, in the step shown in FIG. 3B, to put only the printed circuit 14 in place, without the integrated circuit 11, and to weld the integrated circuit in the step shown in FIG. 3E, prior to the embedding. On the other hand, in FIG. 3A, one could begin with the plate 19 provided with the foil 21 and with its film 23, if present, or in a similar manner one could begin with a one-piece plate with two parallel faces, one of which would be provided solely with the cavity 25. Moreover, the die 28 could be a plane blade that is a good thermal conductor that covers only the printed circuit 14. In that case, a control and stop device would have to be used for controlling the depth to which the printed circuit is driven into the plate 19. The advantage of having a blade extending beyond the printed circuit, as shown, is that it is possible to use the blade as a stop means against the face 19a of the plate.

Figure 4:
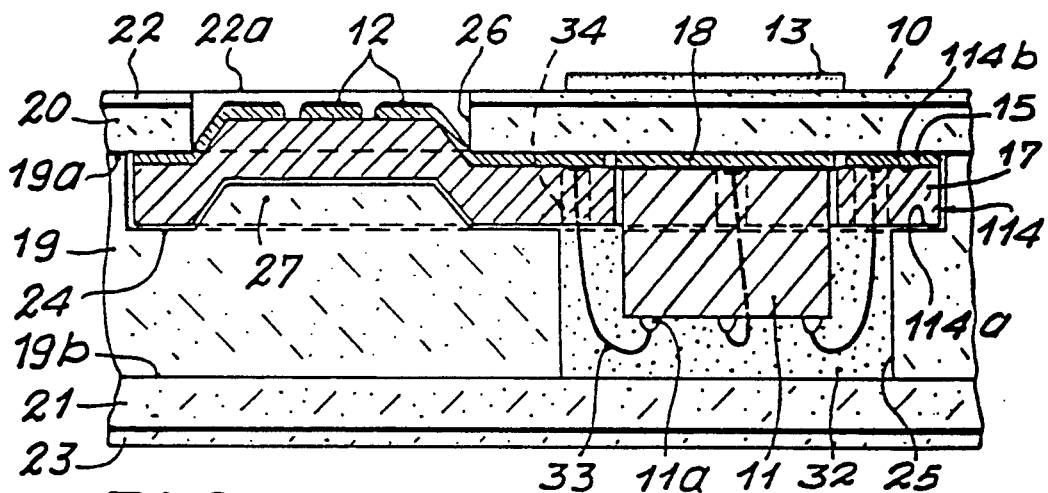
FIG. 4 is a view similar to that of FIG. 1 illustrating a first variant embodiment of a card according to the invention.
Figure 5:
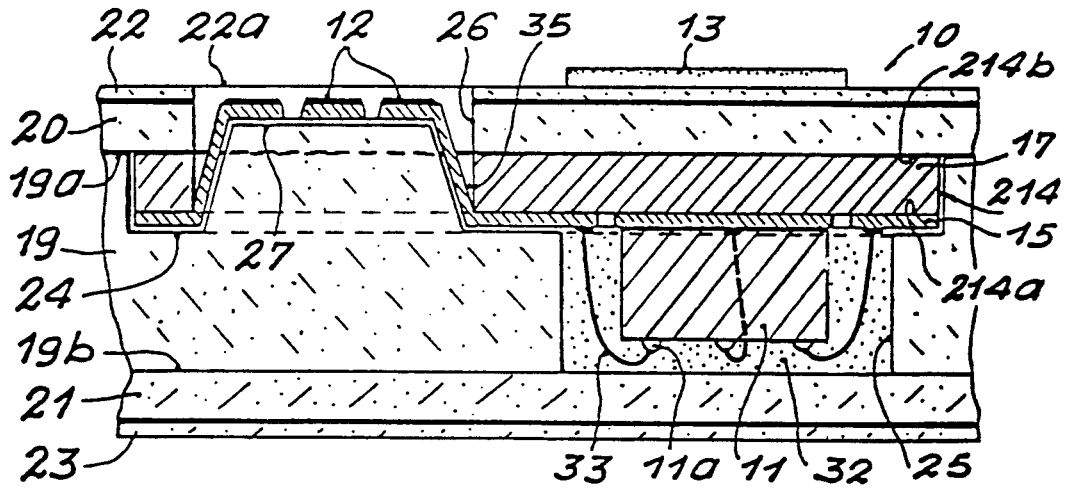
FIG. 5 is a view similar to that of FIG. 1 illustrating a second variant embodiment of a card according to the invention.

FIGS. 4 and 5 illustrate two variant embodiments of a card 10 according to the invention which can be made by the method that has just been described and its variants. The elements of FIG. 1 that remain unchanged in the variants of FIGS. 4 and 5 are identified by the same reference numerals. FIGS. 4 and 5 correspond to two variant embodiments of the printed circuit with offset contacts 14. In FIGS. 4 and 5, the printed circuit is designed for connection with wires, presently known as wire bonding.

In FIG. 4, the printed circuit 114 differs from the circuit 14 only at the level of the integrated circuit 11. The lead 18 closes the opening 16 at the level of the face 114a. The integrated circuit 11 has its back face glued to the lead 18, and the pads 11a are connected to the corresponding conductors 15 by wires 33 that penetrate the substrate 17 in holes 34.

In FIG. 5, the printed circuit 11 is no longer connected through a window 16 as in FIGS. 1 and 4, such that the conductors 15 and the contacts 12 are disposed on the face 214a of the printed circuit 214. Consequently, the contacts cannot be accessible from the face 214b except through a window 35 made in the substrate 17. Each boss 27 must accordingly compensate for the thickness of the substrate 17 and foil 20. Advantageously, the foil 20 and/or the substrate 17 will be thinned down so as not to exert strong stresses on the conductors 15 or in the contacts 14 at the level of the angles formed by each boss 27.

Figure 6:
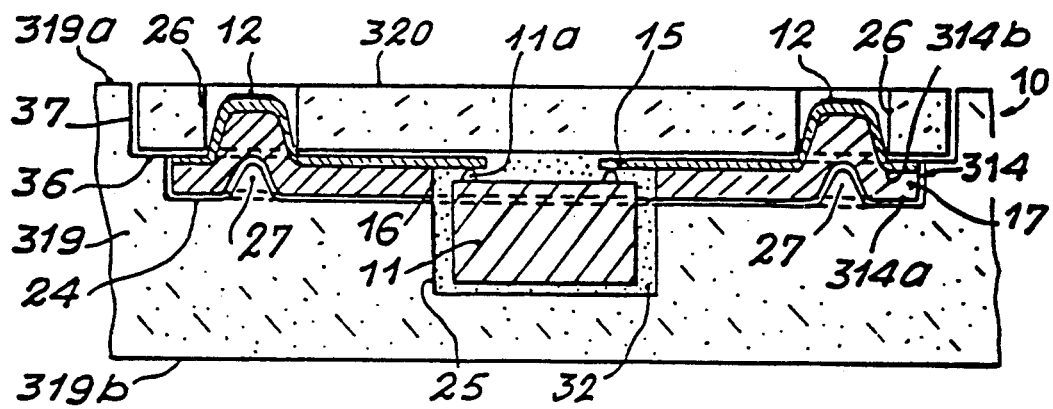
FIG. 6 is a view similar to that of FIG. 1, illustrating a third variant embodiment of a card according to the invention.

FIG. 6 shows another variant embodiment of a card 10 according to the invention. In this variant, the printed circuit 314 is no longer a printed circuit with offset contacts like those described above. Instead, it is a printed circuit as described in the aforementioned French Patent 2 337 381. In the example shown, the two rows of contacts 12 are placed on two opposite sides of the openings 16 made in the substrate 17 of the printed circuit 314. The conductors 15 are placed overhanging about the opening 16 and are welded to the pads 11a of the integrated circuit 11 by the TAB technique. The card 10 is formed of a one-piece small plate 319, the face 319a of which has the cavity 25, the zone 24 and a step 36, which are coaxial. The printed circuit 314 rests on the zone 24, and the integrated circuit 11 is accommodated in the cavity 25. The foil 20 of FIGS. 1–5 here is limited to a cover cap affixed to the step 36 and coplanar with the face 319a of the plate 319. The cover cap 320 has the two openings 26 for giving access to the two rows of contacts 12. According to the invention, the zone 24 has one boss 27 under each opening 26, in a manner similar to that of the foregoing drawing figures. It will be understood that the step 36 could be omitted, and the foil 20 could extend over the entire surface 319a of the plate 319.

The method for manufacture described with reference to FIGS. 1 and 3A–3E could also apply to the second variant mentioned here. The unit comprising the plate 19 and the foils 20 and 21 of the card shown in FIG. 1 would then, in FIG. 3A, comprise the bare plate 319 of FIG. 6. In the case of the card 10 shown in FIG. 6, formed solely by the one-piece plate 319 provided with the step 36 and the cover cap 20, it is clear that the initial state corresponding to FIG. 3A would be the one-piece plate 319 provided with its cavity 25, surrounded by an indented field or zone 37 having the depth of the step 36 and having the surface area of the step, added to that of the face 314b of the printed circuit 314. The zone 24 and its bosses 27 would be formed when the printed circuit is pressed until the upper face 314b of the printed circuit 314 is approximately coplanar with the step 36. The aforementioned field or zone 37 would naturally have the surface area of the face 319a, if the foil 20 were distributed over this face.

We claim:
1. A method of manufacturing a card (10) comprising a printed circuit (14) having one face (14a) which carries an integrated circuit (11) and another face (14b) having a plurality of contacts (12), a plate (19) having one face (19a) which has a plane zone (24) including a boss covered by the printed circuit and a cavity (25) for accommodating the integrated circuit, a foil (20) disposed to cover at least the printed circuit and arranged to provide access to the contacts via at least one opening (26) in the foil, the zone (24) including the boss (27) being disposed under the opening (26) of the foil (20), wherein the printed circuit (14) is accommodated on one face (19a) of the plate (19), the plate (19) being constructed of plastic material and including the zone (24), the boss (27) and the cavity (25) for accommodat- ing the integrated circuit (11), the method comprising the steps of forming the cavity (25) in a uniformly plane zone (37) of the one face of the plate having a predetermined surface area corresponding to that of the foil disposing the printed circuit (14) in the plane zone (37), covering the printed circuit with a predetermined surface area of the foil (20), disposing a plane blade die (28) that is a good thermal conductor and is provided with an opening corresponding to said opening (26) of the foil above the printed circuit (14), heating the plate to a molding temperature, pressing the die to shape the printed circuit such that the upper face (14b) of the printed circuit is approximately coplanar with said plane zone (37) and withdrawing the die.

2. A method as defined by claim 1, characterized in that it further includes forming an indented step (36) in the face (19a) of the plate, the plane zone (37) having the depth of the step (36) and affixing a foil cover cap to said step.

3. A method as defined by claim 2, characterized in that the cavity (25) is a hole penetrating the plate.

4. A method as defined by claim 3, characterized in that it comprises filling the hole with an embedding substance (32).

5. A method as defined by claim 3, characterized in that it comprises covering the other face (19b) of the plate (19) with a second foil (21).

6. A method as defined by claim 1, characterized in that the printed circuit (14) is equipped with the integrated circuit (11).

7. A method as defined by claim 1, characterized in that the printed circuit (14) is equipped with the integrated circuit (11).

8. A method as defined by claim 1, characterized in that the cavity (25) is a hole penetrating the plate.

9. A method as defined by claim 8, characterized in that with the printed circuit (14) not yet equipped with the integrated circuit (11), the method comprises, after the formation of the boss, connecting the integrated circuit (11) to the printed circuit (14) in the hole (25) of the plate (19).

10. A method as defined by claim 9, characterized in that it comprises filling the hole with an embedding substance (32).

11. A method as defined by claim 9, characterized in that it comprises covering the other face (19b) of the plate (19) with a second foil (21).

12. A method as defined by claim 8, characterized in that it comprises filling the hole with an embedding substance (32).

13. A method as defined by claim 8, characterized in that it comprises covering the other face (19b) of the plate (19) with a second foil (21).

* * * * *